US009834746B2

(12) United States Patent
Dory et al.

(10) Patent No.: US 9,834,746 B2
(45) Date of Patent: *Dec. 5, 2017

(54) CLEANING FORMULATIONS FOR REMOVING RESIDUES ON SURFACES (71) Applicant: Fujifilm Electronic Materials U.S.A., Inc., N. Kingstown, RI (US)

(72) Inventors: Thomas Dory, Gilbert, AZ (US); Bing Du, Gilbert, AZ (US); Tomonori Takahashi, Gilbert, AZ (US); Emil A. Kneer, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/485,947

(22) Filed: Sep. 15, 2014

(65) Prior Publication Data

US 2015/0111804 A1   Apr. 23, 2015

Related U.S. Application Data (60) Provisional application No. 61/893,424, filed on Oct. 21, 2013.

(51) Int. Cl.
  *C11D 3/26* (2006.01)
  *C11D 3/28* (2006.01)
  (Continued)

(52) U.S. Cl.
  CPC ........ *C11D 11/0047* (2013.01); *C11D 3/0073* (2013.01); *C11D 3/2003* (2013.01);
  (Continued)

(58) Field of Classification Search
  CPC ... C11D 3/0073; C11D 3/2003; C11D 3/2068; C11D 3/2072; C11D 3/2079;
  (Continued)

(56) References Cited

U.S. PATENT DOCUMENTS 5,795,702 A   8/1998   Tanabe et al.
6,265,781 B1  7/2001   Andreas
(Continued)

FOREIGN PATENT DOCUMENTS

CN   1875325   12/2006   ............... G03F 7/42
CN   1904016   1/2007    ............... C11D 7/32
(Continued)

OTHER PUBLICATIONS

International Search Report and the Written Opinion of the International Searching Authority for International Application No. PCT/US2014/055556 dated Dec. 22, 2014.
(Continued)

*Primary Examiner* — Gregory R Delcotto
(74) *Attorney, Agent, or Firm* — Fish & Richardson P.C.

(57) ABSTRACT

This disclosure relates to a cleaning composition that contains 1) at least one chelating agent, the chelating agent being a polyaminopolycarboxylic acid; 2) at least one organic solvent selected from the group consisting of water soluble alcohols, water soluble ketones, water soluble esters, and water soluble ethers; 3) at least one monocarboxylic acid containing a primary or secondary amino group and at least one additional basic group containing nitrogen; 4) at least one metal corrosion inhibitor, the metal corrosion inhibitor being a substituted or unsubstituted benzotriazole; and 5) water. This disclosure also relates to a method of using the above composition for cleaning a semiconductor substrate.

21 Claims, 1 Drawing Sheet (51) Int. Cl.
| | |
|---|---|
| *C11D 3/33* | (2006.01) |
| *C11D 3/43* | (2006.01) |
| *C11D 11/00* | (2006.01) |
| *C11D 7/50* | (2006.01) |
| *C11D 7/32* | (2006.01) |
| *C11D 3/20* | (2006.01) |
| *G03F 7/42* | (2006.01) |
| *C11D 3/00* | (2006.01) |
| *H01L 21/02* | (2006.01) |

(52) U.S. Cl.
CPC .......... *C11D 3/2068* (2013.01); *C11D 3/2072* (2013.01); *C11D 3/2079* (2013.01); *C11D 3/2082* (2013.01); *C11D 3/2086* (2013.01); *C11D 3/2093* (2013.01); *C11D 7/3245* (2013.01); *C11D 7/3281* (2013.01); *C11D 7/5022* (2013.01); *G03F 7/425* (2013.01); *G03F 7/426* (2013.01); *H01L 21/02063* (2013.01)

(58) Field of Classification Search
CPC ... C11D 3/2082; C11D 2/2086; C11D 2/2093; C11D 3/28; C11D 3/33; C11D 7/261; C11D 7/263; C11D 7/264; C11D 7/265; C11D 7/266; C11D 7/3209; C11D 7/3245; C11D 7/3281; C11D 7/50; C11D 7/5004; C11D 11/0023; B08B 3/04
USPC ....... 510/175, 176, 178, 245, 255, 258, 264, 510/401, 402, 477, 480, 499, 500, 505, 510/506; 134/1.2, 1.3
See application file for complete search history.

(56) References Cited

U.S. PATENT DOCUMENTS

| | | |
|---|---|---|
| 6,287,586 B1 | 9/2001 | Orvig et al. |
| 6,303,557 B1 | 10/2001 | Colclough |
| 6,310,020 B1 | 10/2001 | Shirota et al. |
| 6,447,563 B1 | 9/2002 | Mahulikar |
| 6,599,370 B2 * | 7/2003 | Skee .................... C11D 3/0073 134/10 |
| 6,740,589 B2 | 5/2004 | Shimazu et al. |
| 6,773,873 B2 | 8/2004 | Seijo et al. |
| 6,869,921 B2 | 3/2005 | Koito et al. |
| 6,958,312 B2 | 10/2005 | Chae et al. |
| 7,312,186 B2 | 12/2007 | Takashima et al. |
| 7,387,964 B2 | 6/2008 | So et al. |
| 7,671,001 B2 * | 3/2010 | Skee .................... C11D 3/0073 134/1.3 |
| 7,700,533 B2 | 4/2010 | Egbe et al. |
| 8,092,707 B2 | 1/2012 | Hardy et al. |
| 8,114,220 B2 | 2/2012 | Visintin et al. |
| 8,236,485 B2 | 8/2012 | Minsek et al. |
| 8,361,237 B2 | 1/2013 | Wu et al. |
| 8,404,626 B2 | 3/2013 | Kolics et al. |
| 9,045,717 B2 | 6/2015 | Nakanishi et al. |
| 2002/0077259 A1 * | 6/2002 | Skee .................... C11D 3/0073 510/175 |
| 2003/0232799 A1 | 12/2003 | Wang et al. |
| 2004/0134873 A1 | 7/2004 | Yao et al. |
| 2005/0176602 A1 | 8/2005 | Hsu |
| 2006/0014391 A1 | 1/2006 | Lee et al. |
| 2007/0060490 A1 * | 3/2007 | Skee .................... C11D 3/0073 510/175 |
| 2007/0235061 A1 | 10/2007 | Mizuta et al. |
| 2008/0004197 A1 * | 1/2008 | Kneer .................... C11D 1/54 510/245 |
| 2008/0026583 A1 | 1/2008 | Hardy et al. |
| 2008/0076688 A1 | 3/2008 | Barnes et al. |
| 2008/0214006 A1 | 9/2008 | Lee et al. |
| 2009/0107520 A1 | 4/2009 | Lee et al. |
| 2009/0203566 A1 | 8/2009 | Lee et al. |
| 2009/0281017 A1 | 11/2009 | Suzuki et al. |
| 2009/0286708 A1 | 11/2009 | Murakami et al. |
| 2009/0301996 A1 | 12/2009 | Visintin et al. |
| 2010/0043823 A1 * | 2/2010 | Lee .................... C11D 7/3263 134/1.3 |
| 2010/0152086 A1 | 6/2010 | Wu et al. |
| 2010/0163788 A1 | 7/2010 | Visintin et al. |
| 2011/0076852 A1 | 3/2011 | Takahashi et al. |
| 2011/0237480 A1 | 9/2011 | Mizutani et al. |
| 2012/0021961 A1 | 1/2012 | Klipp et al. |
| 2012/0048295 A1 * | 3/2012 | Du .................... C11D 7/3245 134/3 |
| 2012/0090646 A1 | 4/2012 | Tanaka et al. |
| 2012/0283163 A1 * | 11/2012 | Barnes .................... C11D 1/72 510/175 |
| 2013/0288436 A1 | 10/2013 | Chou et al. |
| 2013/0296214 A1 | 11/2013 | Barnes et al. |
| 2014/0109931 A1 * | 4/2014 | Lee .................... C11D 7/10 134/3 |

FOREIGN PATENT DOCUMENTS

| | | | |
|---|---|---|---|
| CN | 102031204 | 4/2011 | ............ C11D 7/32 |
| CN | 102477359 A | 5/2012 | ............ C11D 7/26 |
| CN | 102770524 | 11/2012 | ............ C11D 3/37 |
| DE | 198 49 648 | 5/2000 | ............ C11D 1/94 |
| EP | 1 755 003 | 2/2007 | ............ G03F 7/42 |
| EP | 2 305 788 | 4/2011 | ............ C11D 11/00 |
| EP | 2 500 407 | 9/2012 | ............ C11D 11/00 |
| GB | 1 347 008 | 2/1974 | ............ C11D 7/32 |
| JP | 2012-021151 A2 | 2/2012 | ............ C11D 7/32 |
| JP | 2013-104104 A2 | 5/2013 | ............ C23F 1/18 |
| TW | I227271 | 2/2005 | ............ C09K 13/00 |
| TW | I315030 | 9/2009 | ............ G03F 7/42 |
| TW | I362571 | 4/2012 | ............ G03F 7/42 |
| WO | WO 02/33033 | 4/2002 | ............ C11D 3/00 |
| WO | WO 03/040252 A2 | 5/2003 | |
| WO | WO 2012/161790 A1 | 11/2012 | ............ C11D 3/43 |
| WO | WO 2013/058770 A1 | 4/2013 | ............ C09K 3/14 |
| WO | WO 2013/101907 | 7/2013 | ............ H01L 21/311 |

OTHER PUBLICATIONS

Supplementary European Search Report for European Application No. EP 14855311 dated Jun. 8, 2017 (3 pages).
Taiwan Search Report for Taiwan Application No. 103142384 dated May 31, 2017 (1 page).
European Office Action for European Application No. 14 855 311.8 dated Jul. 4, 2017 (8 pages).

* cited by examiner

CLEANING FORMULATIONS FOR REMOVING RESIDUES ON SURFACES

CROSS-REFERENCE TO RELATED APPLICATION

The present application claims priority to U.S. Provisional Application Ser. No. 61/893,424, filed on Oct. 21, 2013, the contents of which are hereby incorporated by reference in its entirety.

FIELD OF THE DISCLOSURE

The present disclosure relates to a novel cleaning composition for semiconductor substrates and a method of cleaning semiconductor substrates. More particularly, the present disclosure relates to a cleaning composition for removing plasma etch residues formed on semiconductor substrates after plasma etching of metal layers or dielectric material layers deposited on the substrates and the removal of residues left on the substrates after bulk resist removal via a plasma ashing process.

BACKGROUND OF THE DISCLOSURE

In the manufacture of integrated circuit devices, photoresists are used as an intermediate mask for transferring the original mask pattern of a reticle onto the wafer substrate by means of a series of photolithography and plasma etching steps. One of the essential steps in the integrated circuit device manufacturing process is the removal of the patterned photoresist films from the wafer substrate. In general, this step is carried out by one of two methods.

One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly crosslinked by such treatments and are more difficult to dissolve in the stripper solution. In addition, the chemicals used in these conventional wet-stripping methods are sometimes ineffective for removing inorganic or organometallic residual materials formed during the plasma etching of metal or oxide layers with halogen-containing gases.

An alternative method of removing a photoresist film involves exposing a photoresist-coated wafer to oxygen-based plasma in order to burn the resist film from the substrate in a process known as plasma ashing. However, plasma ashing is also not fully effective in removing the plasma etching by-products noted above. Instead, removal of these plasma etch by-products is typically accomplished by subsequently exposing the processed metal and dielectric thin films to certain cleaning solutions.

Metal substrates are generally susceptible to corrosion. For example, substrates such as aluminum, copper, aluminum-copper alloy, tungsten nitride, tungsten (W), cobalt (Co), titanium oxide, other metals and metal nitrides, will readily corrode and dielectrics [ILD, ULK] can etch by using conventional cleaning chemistries. In addition the amount of corrosion tolerated by the integrated circuit device manufacturers is getting smaller and smaller as the device geometries shrink.

At the same time as residues become harder to remove and corrosion must be controlled to ever lower levels, cleaning solutions must be safe to use and environmentally friendly.

Therefore, the cleaning solution should be effective for removing the plasma etch and plasma ash residues and must also be non-corrosive to all exposed substrate materials.

SUMMARY OF THE DISCLOSURE

The present disclosure is directed to a non-corrosive cleaning composition that is useful primarily for removing residues (e.g., plasma etch and/or plasma ashing residues) from a semiconductor substrate as an intermediate step in a multistep manufacturing process. These residues include a range of relatively insoluble mixtures of organic compounds like residual photoresist, organometallic compounds, metal oxides which are formed as reaction by-products from exposed metals such as aluminum, aluminum/copper alloy, copper, titanium, tantalum, tungsten, cobalt, metal nitrides such as titanium and tungsten nitride, and other materials. An advantage of the cleaning composition described herein is that it can clean a broad range of residues encountered and be generally non-corrosive to exposed substrate materials.

In one aspect, the present disclosure features a cleaning composition containing 1) at least one chelating agent, the chelating agent being a polyaminopolycarboxylic acid; 2) at least one organic solvent selected from the group consisting of water soluble alcohols, water soluble ketones, water soluble esters, and water soluble ethers; 3) at least one monocarboxylic acid containing a primary or secondary amino group and at least one additional basic group containing nitrogen; 4) at least one metal corrosion inhibitor, the metal corrosion inhibitor being a substituted or unsubstituted benzotriazole; and 5) water. In some embodiments, the cleaning composition is a uniform solution.

For example, the cleaning composition can include:
1) about 0.01% to about 0.5% by weight of at least one polyaminopolycarboxylic acid chelating agent;
2) about 2% to about 20% by weight of at least one organic solvent selected from the group consisting of water soluble alcohols, water soluble ketones, water soluble esters, and water soluble ethers;
3) about 0.02% to about 2% of at least one monocarboxylic acid compound containing a primary or secondary amino group and at least one additional nitrogen-containing basic group;
4) about 0.05% to about 2% by weight of at least one metal corrosion inhibitor selected from the group consisting of substituted and unsubstituted benzotriazoles;
5) about 78% to about 98% water, and
6) optionally, from about 1 ppm to about 1000 ppm of a defoaming reagent, wherein the pH of the cleaning composition is from 7 to about 9.

The present disclosure is also directed to a method of cleaning residues from a semiconductor substrate. The method includes contacting a semiconductor substrate containing post etch residues and/or post ash residues with a cleaning composition described herein. For example, the method can include the steps of:
(A) providing a semiconductor substrate containing post etch and/or post ash residues;
(B) contacting said semiconductor substrate with a cleaning composition described herein;
(C) rinsing said semiconductor substrate with a suitable rinse solvent; and
(D) optionally, drying said semiconductor substrate by any means that removes the rinse solvent and does not compromise the integrity of said semiconductor substrate.

BRIEF DESCRIPTION OF DRAWING

In FIG. 1, PER is Post Etch Residue, ILD is Inter Layer Dielectric.

DETAILED DESCRIPTION OF THE DISCLOSURE

As defined herein, unless otherwise noted, all percentages expressed should be understood to be percentages by weight to the total weight of the cleaning composition. Unless otherwise noted, ambient temperature is defined to be between about 16 and about 27 degrees Celsius (° C.).

As defined herein, a "water-soluble" substance (e.g., a water-soluble alcohol, ketone, ester, or ether) refers to a substance having a solubility of at least 5% by weight in water at 25° C.

One embodiment of the present disclosure is directed to a non-corrosive cleaning composition comprising:
1) about 0.01% to about 0.5% by weight of at least one polyaminopolycarboxylic acid chelating agent;
2) about 2% to about 20% by weight of at least one organic solvent selected from the group consisting of water soluble alcohols, water soluble ketones, water soluble esters, and water soluble ethers;
3) about 0.05% to about 2% of at least one monocarboxylic acid compound containing a primary or secondary amino group and at least one additional nitrogen-containing basic group;
4) about 0.02% to about 2% by weight of at least one metal corrosion inhibitor selected from substituted and unsubstituted benzotriazoles;
5) about 78% to about 98% water; and
6) optionally, about 1 ppm to about 1000 ppm of a defoaming reagent,
wherein the pH of the cleaning composition is from 7 to about 9.

The compositions of this disclosure contain at least one polyaminopolycarboxylic acid chelating agent. For the purposes of this disclosure, a polyaminopolycarboxylic acid refers to a compound with a plurality of amino groups and a plurality of carboxylic acid groups. Suitable classes of polyaminopolycarboxylic acid chelating agents include, but are not limited to mono- or polyalkylene polyamine polycarboxylic acids, polyaminoalkane polycarboxylic acids, polyaminoalkanol polycarboxylic acids, and hydroxyalkylether polyamine polycarboxylic acids.

Suitable polyaminopolycarboxylic acid chelating agents include, but are not limited to, butylenediaminetetraacetic acid, diethylenetriaminepentaacetic acid (DTPA), ethylenediaminetetrapropionic acid, triethylenetetraminehexaacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexane tetraacetic acid, ethylendiamine diacetic acid, ethylendiamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, 1,4,7,10-tetraazacyclododecane-tetraacetic acid, diaminopropanol tetraacetic acid, and (hydroxyethyl)ethylene-diaminetriacetic acid. In some embodiments, polyalkylene polyamines such as DTPA and EDTA are preferred.

In some embodiments, the compositions of this disclosure include at least about 0.01% by weight (e.g., at least about 0.05% by weight or at least about 0.1% by weight) and/or at most about 0.5% by weight (e.g., at most about 0.3% by weight or at most about 0.2% by weight) of the polyaminopolycarboxylic acid chelating agent.

The compositions of this disclosure contain at least one organic solvent selected from the group of water soluble alcohols, water soluble ketones, water soluble esters, and water soluble ethers (e.g., glycol diethers).

Classes of water soluble alcohols include, but are not limited to, alkane diols (including, but not limited to, alkylene glycols), glycols, alkoxyalcohols (including but not limited to glycol monoethers), saturated aliphatic monohydric alcohols, unsaturated non-aromatic monohydric alcohols, and low molecular weight alcohols containing a ring structure.

Examples of water soluble alkane diols includes, but are not limited to, 2-methyl-1,3-propanediol, 1,3-propanediol, 2,2-dimethyl - 1,3-propanediol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, diethylene glycol, dipropylene glycol, triethylene glycol and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to allyl alcohol, propargyl alcohol, 2-butenyl alcohol, 3-butenyl alcohol, and 4-penten-2-ol.

Examples of water soluble, low molecular weight alcohols containing a ring structure include, but are not limited, to tetrahydrofurfuryl alcohol, furfuryl alcohol, and 1,3-cyclopentanediol.

Examples of water soluble ketones include, but are not limited to, acetone, propanone, cyclobutanone, cyclopentanone, cyclohexanone, diacetone alcohol, 2-butanone, 1,5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters (such as ethylene glycol monoacetate and diethyleneglycol monoacetate), and glycol monoether monoesters (such as propylene glycol monomethyl ether acetate, ethylene glycol monomethyl ether acetate, propylene glycol monoethyl ether acetate, and ethylene glycol monoethylether acetate).

Examples of water soluble ethers include, but are not limited to, 1,2-dimethoxyethane, diethylene glycol dimethyl ether, and triethylene glycol dimethyl ether.

In some embodiments, the compositions of this disclosure include at least about 2% by weight (e.g., at least about 3% by weight, at least about 5% by weight, or at least about 10% by weight) and/or at most about 20% by weight (e.g., at most about 18% by weight, at most about 15% by weight, or at most about 12% by weight) of the organic solvent.

The compositions of this disclosure contain at least one monocarboxylic acid compound containing a primary or secondary amino group and at least one additional nitrogen-containing basic group. For the purpose of this disclosure, the required primary or secondary amino group is not directly bonded to nor part of another nitrogen containing basic group (e.g. $NH_2$, $H_2NC(=X)$, or $H_2NNHC(=X)$, where $X=O$, S, or NR, R being H or $C_1$-$C_4$ alkyl). In other words, $NH_2NH—$, $H_2NC(=X)NH—$, or $H_2NNHC(=X)NH—$ are not considered the primary or secondary amino group within this disclosure. Thus, a monocarboxylic acid containing such a basic group only (e.g., $NH_2NH—$, $H_2NC(=X)NH—$, or $H_2NNHC(=X)NH—$) does not include a primary or secondary amino group and is therefore excluded from the monocarboxylic acid compound containing a primary or secondary amino group and at least one additional nitrogen-containing derived basic group described in this disclosure. Examples of such excluded monocarboxylic acids include guanidinoacetic acid and 4-guanidinobutyric acid.

Suitable classes of monocarboxylic acid compound containing a primary or secondary amino group and at least one additional nitrogen-containing basic group are those monocarboxylic acid compounds which contain a primary or secondary amino group and at least one of the following nitrogen-containing basic groups selected from the group consisting of imidazolyl, triazolyl, benzotriazolyl, piperazinyl, pyrolyl, pyrrolidinyl, pyrazolyl, piperidinyl, guanidinyl, carbazatyl, hydrazidyl, semicarbazidyl, aminoguanidinyl, primary amino (e.g., $C_1$-$C_{10}$ primary amino), and secondary amino (e.g., $C_1$-$C_{10}$ secondary amino). These groups may be further substituted with substituents, e.g. lower alkyl groups, except for the secondary amino group.

In some embodiments of the disclosure, the at least one monocarboxylic acid compound containing a primary or secondary amino group and at least one additional nitrogen-containing basic group is selected from the compounds described by the generic Structure (I):

$(R^3NH)C(R^1)(R^2)CO_2H$          (I),

In which each of $R^1$ and $R^2$, independently, is a hydrogen atom, $C_1$-$C_4$ alkyl, or a group (e.g., a $C_1$-$C_{10}$ group) having at least one nitrogen-containing basic group; and $R^3$ is a hydrogen atom, $C_1$-$C_{10}$ alkyl, or a group (e.g., a $C_1$-$C_{10}$ group) having at least one nitrogen-containing basic group; in which at least one of $R^1$, $R^2$, and $R^3$ is a group having at least one nitrogen-containing basic group.

In some embodiments, $R^1$ can be a group having at least one nitrogen-containing basic group, in which the group having at least one nitrogen-containing basic group is $C_1$-$C_{10}$ alkyl substituted by amino, guanidinyl, or imidazolyl and optionally further substituted by OH. In such embodiments, $R^2$ can be H or $C_1$-$C_{10}$ alkyl and $R^3$ can be H, $C_1$-$C_{10}$ alkyl, or a group having at least one nitrogen-containing basic group, in which the group having at least one nitrogen-containing basic group is $C_1$-$C_{10}$ alkyl optionally substituted by amino, guanidinyl, or imidazolyl and optionally further substituted by OH.

In some embodiments, $R^3$ can be a group having at least one nitrogen-containing basic group, in which the group having at least one nitrogen-containing basic group is $C_1$-$C_{10}$ alkyl substituted by amino, guanidinyl, or imidazolyl and optionally further substituted by OH. In such embodiments, each of $R^1$ and $R^2$, independently, can be H or $C_1$-$C_4$ alkyl.

In some embodiments of the disclosure, the at least one monocarboxylic acid compound containing a primary or secondary amino group and at least one additional nitrogen-containing basic group is selected from the compounds described Structure (I) described above, where $R^1$ is a group having at least one nitrogen-containing basic group and each of $R^2$ and $R^3$ is a hydrogen atom. Examples of compounds having this structure include, but are not limited to, lysine, 2,3-diaminobutyric acid, 2,4-diaminobutyric acid, ornithine, 2,3-diaminopropionic acid, 2,6-diaminoheptanoic acid, 4-methyl lysine, 3-methyl lysine, 5-hydroxylysine, 3-methyl-L-arginine, arginine, homoarginine, $N^5$-monomethyl-L-arginine, $N^5$-[imino(methylamino)methyl]-D-ornithine, canavanine, and histidine.

In some embodiments of the disclosure, the at least one monocarboxylic acid compound containing a primary or secondary amino group and at least one additional nitrogen-containing basic group is selected from the compounds described by Structure (I) described above, where each of $R^1$ and $R^2$ is a hydrogen atom, and $R^3$ is a $C_1$-$C_{10}$ group containing a group having at least one nitrogen-containing basic group. Examples of compounds having this structure include, but are not limited to, N-(2-aminoethyl)glycine and N-(2-aminopropyl)glycine.

In some embodiments of the disclosure, the at least one monocarboxylic acid compound containing a primary or secondary amino group and at least one additional nitrogen-containing basic group is selected from the compounds described by Structure (I) described above, where $R^1$ is a group having at least one nitrogen-containing basic group, $R^2$ is a hydrogen atom, and $R^3$ is a $C_1$-$C_{10}$ alkyl group. Examples of compounds having this structure include, but are not limited to, N2-methyl lysine, and N2-methyl-L-Arginine.

In some embodiments of the disclosure, the at least one monocarboxylic acid compound containing a primary or secondary amino group and at least one additional nitrogen-containing basic group is selected from the monocarboxylic acid compounds described by Structure (I) described above, where $R^1$ is a group having at least one nitrogen-containing basic group, $R^2$ is a hydrogen atom, and $R^3$ is a group having at least one nitrogen-containing basic group. Examples of compounds having this structure includes, but are not limited to, $N^2$-(2-aminoethyl)-D-arginine, and $N^2$-(2-aminoethyl)-L-arginine.

In some embodiments of the disclosure, the at least one monocarboxylic acid compound containing a primary or secondary amino group and at least one additional nitrogen-containing basic group is selected from the monocarboxylic acid compounds described by Structure (I) described above, where $R^1$ is a $C_1$-$C_4$ alkyl, $R^2$ is a group having at least one nitrogen-containing basic group, and $R^3$ is a hydrogen atom. Examples of compounds having this structure include, but are not limited to, 2-methyllysine and 2-methyl-L-arginine.

In some embodiments of the disclosure, the at least one monocarboxylic acid compound containing a primary or secondary amino group and at least one additional nitrogen-containing basic group is selected from the monocarboxylic acid compounds that have a structure where the required primary or secondary amino group is not bonded to the same carbon as the carboxyl group. Examples of compounds having this structure include, but are not limited to, 3,4-diaminobutyric acid and 3-amino-5-[(aminoiminomethyl) methylamino] pentanoic acid.

In some embodiments, the compositions of this disclosure include at least about 0.02% by weight (e.g., at least about 0.05% by weight, at least about 0.1% by weight, at least about 0.2% by weight, or at least about 0.5% by weight) and/or at most about 2% by weight (e.g., at most about 1.8% by weight, at most about 1.5% by weight, at most about 1.2% by weight, or at most about 1% by weight) of the monocarboxylic acid compound.

The compositions of this disclosure contain at least one metal corrosion inhibitor selected from substituted or unsubstituted benzotriazoles. Suitable classes of substituted benzotriazole include, but are not limited to, benzotriazoles substituted with alkyl groups, aryl groups, halogen groups, amino groups, nitro groups, alkoxy groups, and hydroxyl groups. Substituted benzotriazoles also include those fused with one or more aryl (e.g., phenyl) or heteroaryl groups. For the purposes of this disclosure, the phrase "substituted or unsubstituted benzotriazoles" is defined to exclude any benzotriazole compound simultaneously containing both a carboxyl group and a primary or secondary amino group.

Suitable benzotriazoles for use as a metal corrosion inhibitor include, but are not limited to, benzotriazole (BTA), 5-aminobenzotriazole, 1-hydroxybenzotriazole,5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotrizole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)amiomethyl]-benzotriazole, 5-t-butylbenzotriazole, 5-(1',1'-dimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

In some embodiments, the compositions of this disclosure include at least about 0.05% by weight (e.g., at least about 0.1% by weight, at least about 0.2% by weight, or at least about 0.5% by weight) and/or at most about 2% by weight (e.g., at most about 1.5% by weight, at most about 1.2% by weight, or at most about 1% by weight) of the metal corrosion inhibitor.

The cleaning compositions of the present disclosure further include water. Preferably, the water is de-ionized and ultra-pure, contains no organic contaminants and has a minimum resistivity of about 4 to about 17 mega Ohms. More preferably, the resistivity of the water is at least 17 mega Ohms.

In some embodiments, the compositions of this disclosure include at least about 78% by weight (e.g., at least about 80% by weight, at least about 83% by weight, or at least about 85% by weight) and/or at most about 98% by weight (e.g., at most about 95% by weight, at most about 93% by weight, or at most about 90% by weight) of water.

In some embodiments, the non-corrosive cleaning composition of this disclosure contains, consists, or consists essentially of at least about 0.01% (e.g., at least about 0.05% or at least about 0.1%) to at most about 0.5% (e.g. at most about 0.3% or at most about 0.2%) by weight of at least one polyaminopolycarboxylic acid chelating agent, at least about 2% (e.g., at least about 3%, at least about 5%, or at least about 7%) to at most about 20% (e.g., at most about 18%, at most about 15%, or at most about 12%) by weight of at least one organic solvent selected from the group of water soluble alcohols, water soluble ketones, water soluble esters, and water soluble ethers, at least about 0.02% (e.g., at least about 0.05%, at least about 0.1%, at least about 0.2%, or at least about 0.5%) to at most about 2% (e.g. at most about 1.8%, at most about 1.5%, at most about 1.2%, or at most about 1%) of at least one monocarboxylic acid compound containing a primary or secondary amino group and at least one additional nitrogen-containing basic group, at least about 0.05% (e.g., at least about 0.1%, at least about 0.2%, or at least about 0.5%) to at most about 2% (e.g., at most about 1.5%, at most about 1.2%, or at most about 1.0%) by weight of at least one metal corrosion inhibitor selected from substituted or unsubstituted benzotriazoles; at least about 78% (e.g., at least about 80%, at least about 83%, or at least about 85%) to at most about 98% (e.g., at most about 95%, at most about 93%, or at most about 90%) by weight water, and, optionally, from at least about 1 ppm (e.g., at least about 10 ppm, at least about 15 ppm, at least about 30 ppm, or at least about 50 ppm) to at most about 1000 ppm (e.g., at most about 750 ppm, at most about 500 ppm, at most about 300 ppm, or at most about 100 ppm) of a defoaming reagent, wherein the pH of the non-corrosive cleaning composition is from at least 7 (e.g., at least about 7.1, at least about 7.2, or at least about 7.3) to at most about 9 (e.g., at most about 8.5, at most about 8.2, at most about 8).

In some embodiments, the compositions of this disclosure can have a pH of at least 7 (e.g., at least about 7.1, at least about 7.2, or at least about 7.3) to at most about 9 (e.g., at most about 8.5, at most about 8.2, at most about 8). Without wishing to be bound by theory, it is believed that a cleaning composition having a pH lower than 7 would significantly increase cobalt corrosion and a cleaning composition having a pH higher than 9 would significantly increase corrosion to tungsten. In order to obtain the desired pH, the relative concentrations of the polyaminopolycarboxylic acid, the benzotriazole (or its derivative), and the monocarboxylic acid compound containing a primary or secondary amino group and at least one additional nitrogen-containing basic group may be adjusted.

In addition, in some embodiments, the cleaning compositions of the present disclosure may contain additives, such as additional pH adjusters, corrosion inhibitors not containing a carboxyl group, surfactants, organic solvents, biocides, and defoaming agents, as optional components.

Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (as described in U.S. Pat. No. 6,717,019, herein incorporated by reference).

In some embodiments, the cleaning compositions of the present disclosure may specifically exclude one or more of additive components, in any combination, if more than one. Such components are selected from the group consisting of pH adjusters, corrosion inhibitors (e.g., those not containing a carboxyl group or non-azole corrosion inhibitors), surfactants (e.g., those other than defoaming agents), organic solvents (e.g., water insoluble organic solvents) other than water soluble alcohols, water soluble ketones, water soluble esters, and water soluble ethers, biocides, defoaming agents, oxygen scavengers, quaternary ammonium hydroxides, amines, alkaline bases (such as NaOH, KOH, and LiOH), fluoride containing compounds, oxidizing agents (e.g., peroxides, oxoammonium compounds, inorganic oxidizing agents, peracids), abrasives, hydroxycarboxylic acids, and carboxylic acids lacking amino groups and polycarboxylic acids lacking amino groups).

In general, the cleaning compositions of the present disclosure are not specifically designed to remove bulk photoresist films from semiconductor substrates. Rather, the cleaning compositions of the present disclosure are generally designed to remove all residues after bulk resist removal by dry or wet stripping methods. Therefore, the cleaning method of the present disclosure is preferably employed after a dry or wet photoresist stripping process. This photoresist stripping process is generally preceded by a pattern transfer process, such as an etch or implant process, or it is done to correct mask errors before pattern transfer. The chemical makeup of the residue will depend on the process or processes preceding the cleaning step.

Any suitable dry stripping process can be used to remove bulk resist from semiconductor substrates. Examples of suitable dry stripping processes include oxygen based plasma ashing, such as a fluorine/oxygen plasma or a $N_2/H_2$ plasma; ozone gas phase-treatment; fluorine plasma treatment, hot $H_2$ gas treatment (such as that described in U.S. Pat. No. 5,691,117 incorporated herein by reference in its entirety), and the like. In addition, any conventional organic wet stripping solution known to a person skilled in the art can be used to remove bulk resist from semiconductor substrates.

A preferred stripping process used in combination with the cleaning method of the present disclosure is a dry stripping process. Preferably, this dry stripping process is the oxygen based plasma ashing process. This process removes most of the photoresist from the semiconductor substrate by applying a reactive-oxygen atmosphere at elevated temperatures (typically 250° C.) at vacuum conditions (i.e. 1 torr). Organic materials are oxidized by this process and are removed with the process gas. However, this process does not remove inorganic or organometallic contamination from the semiconductor substrate. A subsequent cleaning of the semiconductor substrate with the cleaning composition of the present disclosure is typically necessary to remove those residues.

One embodiment of the present disclosure is a method of cleaning residues from a semiconductor substrate that includes contacting a semiconductor substrate containing post etch residues and/or post ash residues with a cleaning composition described herein. The method can further include rinsing the semiconductor substrate with a rinse solvent after the contacting step and/or drying the semiconductor substrate after the rinsing step.

In some embodiments, the cleaning method includes the steps of:
(A) providing a semiconductor substrate containing post etch and/or post ash residues;
(B) contacting said semiconductor substrate with a cleaning composition described herein;
(C) rinsing said semiconductor substrate with a suitable rinse solvent; and
(D) optionally, drying said semiconductor substrate by any means that removes the rinse solvent and does not compromise the integrity of said semiconductor substrate.

In some embodiments, the cleaning method further includes forming a semiconductor device (e.g., an integrated circuit device such as a semiconductor chip) from the semiconductor substrate obtained by the method described above.

The semiconductor substrates to be cleaned in this method can contain organic and organometallic residues, and additionally, a range of metal oxides that need to be removed. Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, and silicon, titanium nitride, tantalum nitride, and tungsten. Said semiconductor substrate may also contain layers of silicon oxide, silicon nitride, silicon carbide and carbon doped silicon oxides.

The semiconductor substrate can be contacted with a cleaning composition by any suitable method, such as placing the cleaning composition into a tank and immersing and/or submerging the semiconductor substrates into the cleaning composition, spraying the cleaning composition onto the semiconductor substrate, streaming the cleaning composition onto the semiconductor substrate, or any combinations thereof. Preferably, the semiconductor substrates are immersed into the cleaning composition.

The cleaning compositions of the present disclosure may be effectively used up to a temperature of about 90° C. Preferably, the cleaning compositions can be used from about 25° C. to about 80° C. More preferably, the cleaning compositions can be employed in the temperature range from about 30° C. to about 60° C. and most preferred is a temperature range of about 40° C. to about 60° C.

Similarly, cleaning times can vary over a wide range depending on the particular cleaning method and temperature employed. When cleaning in an immersion batch type process, a suitable time range is, for example, up to about 60 minutes. A preferred range for a batch type process is from about 1 minute to about 60 minutes. A more preferred time range for a batch type process is from about 3 minutes to about 20 minutes. A most preferred time range for a batch type cleaning process is from about 4 minutes to about 15 minutes.

Cleaning times for a single wafer process may range from about 10 seconds to about 5 minutes. A preferred cleaning time for a single wafer process may range from about 15 seconds to about 4 minutes. A more preferred cleaning time for a single wafer process may range from about 15 seconds to about 3 minutes. A most preferred cleaning time for a single wafer process may range from about 20 seconds to about 2 minutes.

To further promote the cleaning ability of the cleaning composition of the present disclosure, mechanical agitation means may be employed. Examples of suitable agitation means include circulation of the cleaning composition over the substrate, streaming or spraying the cleaning composition over the substrate, and ultrasonic or megasonic agitation during the cleaning process. The orientation of the semiconductor substrate relative to the ground may be at any angle. Horizontal or vertical orientations are preferred.

The cleaning compositions of the present disclosure can be used in conventional cleaning tools known to those skilled in the art. A significant advantage of the compositions of the present disclosure is that they include relatively non-toxic, non-corrosive, and non-reactive components in whole and in part, whereby the compositions are stable in a wide range of temperatures and process times. The compositions of the present disclosure are chemically compatible with practically all materials used to construct existing and proposed semiconductor wafer cleaning process tools for batch and single wafer cleaning.

Subsequent to the cleaning, the semiconductor substrate is rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Preferred examples of rinse solvents include, but are not limited to, DI water, methanol, ethanol and isopropyl alcohol. More preferred rinse solvents are DI water and isopropyl alcohol. The most preferred rinse solvent is DI water. The solvent may be applied using means similar to that used in applying a cleaning composition described herein. The cleaning composition may have been removed from the semiconductor substrate prior to the start of the rinsing step or it may still be in contact with the semiconductor substrate at the start of the rinsing step. Preferably, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

In some embodiments, a method of manufacturing an integrated device using a cleaning composition described herein can include the following steps. First, a layer of a photoresist is applied to a semiconductor substrate. The semiconductor substrate thus obtained can then undergo a pattern transfer process, such as an etch or implant process, to form an integrated circuit. The bulk of the photoresist can then be removed by a dry or wet stripping method (e.g., an oxygen based plasma ashing process). Remaining residues on the semiconductor substrate can then be removed using a cleaning composition described herein in the manner described above. The semiconductor substrate can subsequently be processed to form one or more additional circuits on the substrate or can be processed to form into a semiconductor chip by, for example, assembling (e.g., dicing and bonding) and packaging (e.g., chip sealing).

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a 1 inch stirring bar at 300 rpm unless otherwise noted.

General Procedure 1

Formulation Blending

Samples of cleaning compositions were prepared by adding, while stirring, to the calculated amount of ultra-pure deionized water (DIW) the components of the cleaning formulation except the following components: pH adjuster, the monocarboxyolic acid compound containing a primary or secondary amino group and at least one additional nitrogen-containing basic group, and any optional additives. After a uniform solution was achieved, the optional additives, if used, were added. Formulation of the composition was completed by the addition of the pH adjuster and/or monocarboxyolic acid compound containing a primary or secondary amino group and at least one additional nitrogen-containing basic group. The solution was allowed to equilibrate and the pH of the cleaning composition was taken, if desired.

The pH measurements, if desired, were taken at ambient temperature (17-25° C.) after all components were fully dissolved. Beckman Coulter Φ400 Series Handheld meters can be used for these pH measurements. All components used were commercially available and of high purity.

General Procedure 2

Cleaning Evaluation with Beaker Test

Figure 1:
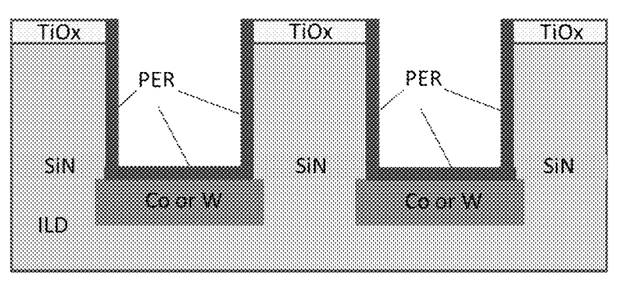
FIG. 1 is a representative illustration of a partially completed device containing post etching residue that can be cleaned by a cleaning composition described in this disclosure.

The patterned wafers, containing materials and features shown in FIG. 1, were diced into test coupons containing these key features for the cleaning tests.

The cleaning of a PER from a substrate was carried out with the described cleaning compositions using a multilayered substrate of Photoresist/TiOx/SiN/Co/ILD or Photoresist/TiOx/SiN/W/ILD that had been patterned lithographically, etched in a plasma metal etcher, and followed by oxygen plasma ashing to remove the top layer of photoresist completely.

The test coupons were held using 4" long plastic locking tweezers, whereby the coupon could then be suspended into a 500 ml volume glass beaker containing approximately 200 milliliters of the cleaning compositions of the present disclosure. Prior to immersion of the coupon into the cleaning composition, the composition was pre-heated to the desired test condition temperature (typically 40° C. or 60° C. as noted) with controlled stirring. The cleaning tests were then carried out by placing the coupon which was held by the plastic tweezers into the heated composition in such a way that the PER layer containing side of the coupon faced the stir bar. The coupon was left static in the cleaning composition for a time period (typically 2 to 5 minutes) while the composition was kept at the test temperature under controlled stirring. When the desired cleaning time was completed, the coupon was quickly removed from the cleaning composition and placed in a 500 ml plastic beaker filled with approximately 400 ml of DI water at ambient temperature (~17° C.) with gentle stirring. The coupon was left in the beaker of DI water for approximately 30 seconds, and then quickly removed, and rinsed under a DI water stream at ambient temperature for about 30 seconds. The coupon was immediately exposed to a nitrogen gas stream from a hand held nitrogen blowing gun, which caused any droplets on the coupon surface to be blown off the coupon, and further, to completely dry the coupon device surface. Following this final nitrogen drying step, the coupon was removed from the plastic tweezers holder and placed into a covered plastic carrier with the device side up for short term storage no greater than about 2 hours. The scanning electron microscopy (SEM) images were then collected for key features on the cleaned test coupon device surface.

General Procedure 3

Materials Compatibility Evaluation with Beaker Test

The blanket Co on silicon substrate, W on silicon substrate, TiOx on SiO2 on silicon substrate, SiN on silicon substrate, ILD on silicon substrate were diced into approximately 1 inch×1 inch square test coupons for the materials compatibility tests. The test coupons were initially measured for thickness or sheet resistance by the 4-point probe, CDE Resmap 273 for metallic film (Co, W), or by Elipsometry for dielectric film (TiOx, SiN and ILD) using a Woollam M-2000X. The test coupons were then installed on the 4" long plastic locking tweezers and treated as described in the cleaning procedure in General Procedure 2 with the Co, W, TiOx, SiN, or ILD layer containing side of the coupon faced the stir bar for 10minutes.

After the final nitrogen drying step, the coupon was removed from the plastic tweezers holder and placed into a covered plastic carrier. The post-thickness or sheet resistance was then collected on the post-processing test coupon surface by the 4-point probe, CDE Resmap 273 for metallic film (Co and W) or by Elipsometry for dielectric film (TiOx, SiN and ILD) using a Woollam M-2000X.

General Procedure 4

Chemistry Foaming Evaluation

The ASTM D892-13 standard Test method for foaming was followed. 30 ml of a test composition was put in a 100 ml cylinder. The cylinder top was covered by a plastic film such as PARAFILM® to prevent the composition from leaking. The cylinder was shaken rapidly for 30 seconds in order to generate foam. After shaking, the cylinder was placed on a static stage and the foam height measured after 5, 10, 15, 30, and 60 seconds.

Formulation Examples FE1-FE14

Table 1 contains formulations FE1-FE14 prepared by General Procedure 1.

TABLE 1

| # | Organic solvent | Chelating agent | Corrosion inhibitor | Monocarboxylic acid | water | pH |
|---|---|---|---|---|---|---|
| FE-1 | 10% EGBE | 0.05% DTPA | 0.22% 5MBTA | 0.08% L-arginine | remainder | 7.3 |
| FE-2 | 10% EGBE | 0.05% DTPA | 0.22% 5MBTA | 0.07% L-arginine | remainder | 7.1 |
| FE-3 | 10% EGBE | 0.05% DTPA | 0.22% 5MBTA | 0.21% L-arginine | remainder | 8.0 |
| FE-4 | 10% EGBE | 0.05% DTPA | 0.22% 5MBTA | 0.50% L-arginine | remainder | 8.5 |
| FE-5 | 10% EGBE | 0.05% DTPA | 0.22% 5MBTA | 1.22% L-Histidine | remainder | 7.3 |
| FE-6 | 10% EGBE | 0.05% DTPA | 0.22% 5MBTA | 0.07% L-lysine | remainder | 7.3 |
| FE-7 | 5% Cy-Hex | 0.05% DTPA | 0.22% 5MBTA | 0.08% L-arginine | remainder | 7.3 |
| FE-8 | 10% DAA | 0.05% DTPA | 0.22% 5MBTA | 0.08% L-arginine | remainder | 7.3 |
| FE-9 | 5% EA | 0.05% DTPA | 0.22% 5MBTA | 0.08% L-arginine | remainder | 7.3 |
| FE-10 | 10% PGME | 0.05% DTPA | 0.22% 5MBTA | 0.08% L-arginine | remainder | 7.3 |
| FE-11 | 10% EGDME | 0.05% DTPA | 0.22% 5MBTA | 0.08% L-arginine | remainder | 7.3 |
| FE-12 | 10% EGBE | 0.05% DTPA | 0.11% 5MBTA | 0.08% L-arginine | remainder | 7.3 |
| FE-13 | 10% EGBE | 0.05% DTPA | 0.80% BTA | 0.08% L-arginine | remainder | 7.3 |
| FE-14 | 10% EGBE | 0.05% EDTA | 0.22% 5MBTA | 0.08% L-arginine | remainder | 7.3 |

Comparative Formulation Examples

Table 2 contains comparative formulation examples CFE-1 to CFE-19 prepared according to General Procedure 1.

TABLE 2

| # | Organic solvent | Chelating agent | Corrosion inhibitor | Monocarboxylic acid | pH adjuster | other additives | water | pH |
|---|---|---|---|---|---|---|---|---|
| CFE-1 | 10% EGBE | 0.05% DTPA | 0.22% 5MBTA | | 0.12% DBU | | remainder | 7.3 |
| CFE-2 | 10% EGBE | 0.05% DTPA | 0.22% 5MBTA | 0.2% Aminoguanidine bicarbonate | | | remainder | 7.3 |
| CFE-3 | 10% EGBE | 0.05% DTPA | 0.22% 5MBTA | 0.09% Tetramethyl guanidine | | | remainder | 7.3 |
| CFE-4 | 10% EGBE | 0.05% DTPA | 0.22% 5MBTA | 0.005% 1,3-Diphenyl-guanidine | 0.11% DBU | | remainder | 7.3 |
| CFE-5 | 10% EGBE | 0.05% DTPA | 0.22% 5MBTA | 1.0% glycine | 0.32% DBU | | remainder | 8.1 |
| CFE-6 | 10% EGBE | 0.05% DTPA | 0.22% 5MBTA | 0.20% Guanidino-acetic acid | 0.10% DBU | | remainder | 7.3 |
| CFE-7 | 10% EGBE | 0.05% DTPA | 0.22% 5MBTA | 0.25% 4-Guanidino-butyric acid | 0.09% DBU | | remainder | 7.3 |
| CFE-8 | 10% EGBE | 0.05% DTPA | 0.22% 5MBTA | 0.25% Agmatine sulfate | 0.15% DBU | | remainder | 7.3 |
| CFE-9 | 10% EGBE | 0.05% DTPA | 0.22% 5MBTA | 0.20% Tricine | 0.11% DBU | | remainder | 7.3 |
| CFE-10 | 10% EGBE | 0.05% DTPA | 0.22% 5MBTA | | 0.03% NH$_4$OH | | remainder | 7.3 |
| CFE-11 | 10% EGBE | 0.05% DTPA | 0.22% 5MBTA | | 0.02% MEA | | remainder | 7.3 |
| CFE-12 | 10% EGBE | 0.05% DTPA | 0.22% 5MBTA | | 0.03% TMAH | | remainder | 7.3 |
| CFE-13 | 10% EGBE | 0.05% DTPA | 0.22% 5MBTA | | 7.65% DBU | 0.97% HF | remainder | 8.2 |
| CFE-14 | 10% EGBE | 0.05% DTPA | 0.22% 5MBTA | | 2.51% DBU | 1% Malic acid | remainder | 8.4 |
| CFE-15 | 10% EGBE | 0.05% DTPA | 0.22% 5MBTA | | 4.77% DBU | 2% HAS | remainder | 8.0 |
| CFE-16 | | 0.05% DTPA | 0.22% 5MBTA | 0.08% Arg | | | remainder | 7.3 |
| CFE-17 | 10% EGBE | 0.05% DTPA | | 0.08% Arg | | | remainder | 7.3 |

TABLE 2-continued

| | Formulation [wt %] | | | | | | | |
|---|---|---|---|---|---|---|---|---|
| # | Organic solvent | Chelating agent | Corrosion inhibitor | Monocarboxylic acid | pH adjuster | other additives | water | pH |
| CFE-18 | 10% EGBE | 0.50% Citric acid | 0.22% 5MBTA | 1.76% Arg | | | remainder | 7.3 |
| CFE-19 | 10% EGBE | | 0.22% 5MBTA | 0.08% Arg | | | remainder | 7.3 |

EGBE = ethylene glycol butyl ether;
DTPA = diethylenetriamine pentaacetic acid;
5MBTA = 5-methylbenzotriazole;
MEA = monoethanolamine;
TMAH = tetramethylammonium hydroxide;
HF = Hydrofluoric acid;
HAS = hydroxylammonium sulfate

DBU = 1,8-diazabicyclo[5.4.0]undec-7-ene;

Aminoguanidine bicarbonate

Tetramethylguanidine

1,3-Diphenylguanidine

Glycine

Guanidinoacetic acid

4-Guanidinobutyric acid

Agmatine sulfate

Tricine

Examples 1-6 and Comparative Examples CE1-CE15

Compatability of Cleaners with Exposed Metals

Formulation Examples 1-6 and Comparative Formulation Examples CFE1-CFE15 were tested for materials compatibility according to General Procedure 3 at 60° C. for 10 minutes. The etch rates of Co, W, and TiOx in the cleaning compositions are shown in Table 3.

TABLE 3

| EX. # | FORM. # | pH | Co ER [A/min] | W ER [A/min] | TiOx ER [A/min] |
|---|---|---|---|---|---|
| 1 | FE-1 | 7.3 | 0.2 | 0.5 | 0.1 |
| 2 | FE-2 | 7.1 | 0.1 | 0.4 | 0.1 |
| 3 | FE-3 | 8.0 | 0.1 | 0.7 | 0.2 |
| 4 | FE-4 | 8.5 | 0.1 | 0.8 | 0.2 |
| 5 | FE-5 | 7.3 | 0.1 | 0.4 | 0.2 |
| 6 | FE-6 | 7.3 | 0.2 | 1.0 | 0.1 |
| CE1 | CFE-1 | 7.3 | 0.6 | 4.0 | 0.2 |
| CE2 | CFE-2 | 7.3 | 0.0 | 3.5 | 0.2 |
| CE3 | CFE-3 | 7.3 | 0.0 | 3.5 | 0.3 |
| CE4 | CFE-4 | 7.3 | 0.0 | 2.0 | 0.2 |
| CE5 | CFE-5 | 8.1 | 2.1 | 3.4 | 0.2 |
| CE6 | CFE-6 | 7.3 | 0.1 | 3.9 | 0.0 |
| CE7 | CFE-7 | 7.3 | 0.1 | 3.2 | 0.1 |
| CE8 | CFE-8 | 7.3 | 0.1 | 3.6 | 0.1 |
| CE9 | CFE-9 | 7.3 | 0.2 | 2.1 | 0.1 |
| CE10 | CFE-10 | 7.3 | 0.0 | 5.9 | 0.1 |
| CE11 | CFE-11 | 7.3 | 0.0 | 3.8 | 0.1 |
| CE12 | CFE-12 | 7.3 | 0.1 | 3.9 | 0.1 |
| CE13 | CFE-13 | 8.2 | 0.1 | 4.0 | 0.3 |
| CE14 | CFE-14 | 8.4 | 0.1 | 4.8 | 0.1 |
| CE15 | CFE-15 | 8.0 | 0.1 | 4.4 | 0.2 |

The results in Table 3 show that the formulations of this disclosure (i.e., FE-1 to FE-6) have low etch rates for all of Co, W, and TiOx. Formulations with a) similar pH but obtaining basic pH in another manner, b) formulations having compounds similar to the monocarboxylic acids of this disclosure but missing one of the functional groups, and c) other types of cleaning formulations of the prior art do not simultaneously provide low Co, W, and TiOx etch rates.

Examples 7-12 and Comparative Example CE16

Various formulations of this disclosure and a comparative formulation were tested for cleaning and materials compatibility at 40° C. The results are reported in Table 4.

TABLE 4

| EX. # | FORM. # | Cleaning* | Co ER [A/min] | W ER [A/min] | TiOx ER [A/min] | SiN ER [A/min] | ILD ER [A/min] |
|---|---|---|---|---|---|---|---|
| 7 | FE-1 | 10 | 0.3 | 0.4 | 0.2 | 0.1 | 0.1 |
| 8 | FE-7 | 6 | 0.1 | 0.4 | 0.1 | 0.1 | 0.1 |
| 9 | FE-8 | 8 | 0.1 | 0.4 | 0.2 | 0.1 | 0.1 |
| 10 | FE-9 | 5 | 0.0 | 0.2 | 0.3 | 0.1 | 0.0 |
| 11 | FE-10 | 9 | 0.1 | 0.4 | 0.2 | 0.1 | 0.1 |
| 12 | FE-11 | 8 | 0.1 | 0.3 | 0.1 | 0.1 | 0.0 |
| CE16 | CFE-16 | 2 | 0.8 | 0.4 | 0.2 | 0.2 | 0.1 |

*1 = plasma etch residue is not removed, 10 = plasma etch residue is completely removed.

The results in Table 4 show that selected solvents provide excellent materials compatibility, including to silicon nitride and an inner layer dielectric, and show improved cleaning and Co compatibility over the comparative example having no selected organic solvent.

Examples 13-16 and Comparative Examples CE17-CE19

Various compositions of this disclosure and comparative formulations were tested for materials compatibility according to General Procedure 3 at 60° C. The results are provided in Table 5.

TABLE 5

| EX. # | FORM. # | Chelating agent | Corrosion inhibitor | Monocarboxylic acid | Co ER [A/min] | W ER [A/min] | TiOx ER [A/min] |
|---|---|---|---|---|---|---|---|
| 13 | FE-1 | 0.05% DTPA | 0.22% 5MBTA | 0.08% Arg | 0.2 | 0.5 | 0.1 |
| 14 | FE-12 | 0.05% DTPA | 0.11% 5MBTA | 0.08% Arg | 0.1 | 0.7 | 0.1 |
| CE17 | CFE-17 | 0.05% DTPA | none | 0.08% Arg | 20.7 | 0.7 | 0.1 |
| 15 | FE-13 | 0.05% DTPA | 0.80% BTA | 0.08% Arg | 0.2 | 0.8 | 0.1 |
| 16 | FE-14 | 0.05% EDTA | 0.22% 5MBTA | 0.08% Arg | 0.1 | 0.8 | 0.1 |
| CE18 | CFE-18 | 0.50% Citric acid | 0.22% 5MBTA | 1.76% Arg | 20.4 | 0.7 | 0.1 |
| CE19 | CFE-19 | none | 0.22% 5MBTA | 0.08% Arg | 0.1 | 1.5 | 0.1 |

The results in Table 5 show the importance of the polyaminopolycarboxylic acid chelating agent. Without the polyaminopolycarboxylic acid, the W etch rate went up significantly. See Example CE19. Replacing the polyaminopolycarboxylic acid chelating agent with citric acid, a known chelating agent without any amino group, the W etch rate was held in check but the Co etch rate went up significantly. See Example CE18. Similarly, the importance of the benzotriazole derivative was shown by the significant increase in Co etch rate when the benzotriazole derivative was not present. See Example CE17.

Examples 17 and 18 and Comparative Examples CE20 and CE21

The pH stability of selected formulations employed to obtain the data in Table 5 was tested according to General Procedure 1 initially after formulation and then 24 hours later. The results are provided in Table 6.

TABLE 6

| EX. # | FORM. # | Chelating agent | Corrosion inhibitor | Monocarboxylic acid | Co ER [A/min] | W ER [A/min] | TiOx ER [A/min] | pH T = 0, (T = 24 hr) |
|---|---|---|---|---|---|---|---|---|
| 17 | FE-1 | 0.05% DTPA | 0.22% 5MBTA | 0.08% Arg | 0.2 | 0.5 | 0.2 | 7.3 (7.2) |
| 18 | FE-14 | 0.05% EDTA | 0.22% 5MBTA | 0.08% Arg | 0.1 | 0.6 | 0.1 | 7.3 (7.2) |
| CE20 | CFE-18 | 0.50% Citric acid | 0.22% 5MBTA | 1.76% Arg | 20.6 | 0.7 | 0.1 | 7.3 (7.1) |
| CE21 | CFE-19 | None | 0.22% 5MBTA | 0.08% Arg | 13.6 | 1.6 | 0.1 | 7.3 (5.8) |

The results in Table 6 indicate that the chelating agent helps control composition pH stability.

Formulation Examples FE-15-FE-21, Examples 19-31 and Comparative Experiment CE22

Formulations of this disclosure employed in Table 4 experiments and formulations of this disclosure containing a defoamer were tested for foaming using General Procedure 4. The formulations of this disclosure containing a defoamer were prepared as described in Table 7. Table 8 contains the results of the foaming tests.

TABLE 7

| Form. # | Formulation [wt %] | | | | | | |
|---|---|---|---|---|---|---|---|
| | ORGANIC SOLVENT | CHELATING AGENT | CORROSION INHIBITOR | MONOCARBOXYLIC ACID | DEFOAMER | WATER | pH |
| FE-15 | 10% EGBE | 0.05% DTPA | 0.22% 5MBTA | 0.08% Arg. | 300 ppm PEGME MW = 5000 | remainder | 7.3 |
| FE-16 | 10% EGBE | 0.05% DTPA | 0.22% 5MBTA | 0.08% Arg. | 300 ppm EOPO MW = 1100 | remainder | 7.3 |
| FE-17 | 10% EGBE | 0.05% DTPA | 0.22% 5MBTA | 0.08% Arg. | 300 ppm EOPO MW = 2700 | remainder | 7.3 |
| FE-18 | 10% EGBE | 0.05% DTPA | 0.22% 5MBTA | 0.08% Arg. | 300 ppm EOPO MW = 5800 | remainder | 7.3 |
| FE-19 | 10% EGBE | 0.05% DTPA | 0.22% 5MBTA | 0.08% Arg. | 300 ppm MD-20 | remainder | 7.3 |
| FE-20 | 10% EGBE | 0.05% DTPA | 0.22% 5MBTA | 0.08% Arg. | 30 ppm MD-20 | remainder | 7.3 |
| FE-21 | 10% EGBE | 0.05% DTPA | 0.22% 5MBTA | 0.08% Arg. | 3 ppm MD-20 | remainder | 7.3 |

EGBE = ethylene glycol butyl ether; DTPA = diethylenetriamine pentaacetic acid; 5MBTA = 5-methylbenzotriazole; Arg = L-arginine; PEGME = polyethylene glycol methyl ether; EOPO = ethylene oxide propylene oxide co-polymer; MD-20 = SURFYNOL ® MD-20 DEFOAMER, [OXIRANE,[[(2-ETHYLHEXYL)OXY]METHYL]-,RX PROD W/POLYETHYLENE GLYCOL ETHER W/2,4,7,9-TETRAMETHYL-5-DECYNE-4-,7-DIOL(2:1] a product available from of Air Products).

TABLE 8

| EX. # | FORM.# | Solvent | Defoamer | Defoaming[1] |
|---|---|---|---|---|
| 19 | FE-1 | 10% EGBE | none | 1 |
| 20 | FE-7 | 5% Cy-Hex | none | 3 |
| 21 | FE-8 | 10% DAA | none | 8 |
| 22 | FE-9 | 5% EA | none | 2 |
| 23 | FE-10 | 10% PGME | none | 1 |
| 24 | FE-11 | 10% EGDME | none | 1 |
| CE22 | CFE-16 | none | none | 7 |
| 25 | FE-15 | 10% EGBE | 300 ppm PEGME Mw = 5000 | 3 |
| 26 | FE-16 | 10% EGBE | 300 ppm EOPO Mw = 1100 | 2 |
| 27 | FE-17 | 10% EGBE | 300 ppm EOPO Mw = 2700 | 3 |
| 28 | FE-18 | 10% EGBE | 300 ppm EOPO Mw = 5800 | 4 |
| 29 | FE-19 | 10% EGBE | 300 ppm MD-20 | 10 |
| 30 | FE-20 | 10% EGBE | 30 ppm MD-20 | 10 |
| 31 | FE21 | 10% EGBE | 3 ppm MD-20 | 7 |

Note for Foaming test rating: 1= the foam is not gone in 60 seconds, 10 = the foam is gone in 5 seconds.

As shown in Table 8, the foaming of the cleaning formulations varied with the solvent used. The results also show that the addition of small amounts of a defoamer can significantly decrease the amount of foam in compositions containing organic solvents with a tendency to foam.

Formulation Examples FE-22-FE-29

To further illustrate formulations of this disclosure, formulations FE-22-FE-29 are described in Table 9.

TABLE 9

| Form. # | Organic Solvent | Chelating Agent | Corrosion Inhibitor | Monocarboxylic Acid | Water |
|---|---|---|---|---|---|
| FE-22 | 2% diethylene glycol | 0.1% triethylenetetramine-hexaacetic acid | 0.4% benzotriazole | 0.5% arginine | remainder |
| FE-23 | 15% 3-methoxy-1-butanol | 0.1% trans-1,2-diaminocyclohexane tetraacetic acid | 0.3% 5-methyl-benzotriazole | 1% lycine | remainder |
| FE-24 | 5% 1-hexanol | 0.1% diaminopropanol tetraacetic acid | 2% benzotriazole | 2% histidine | remainder |
| FE-25 | 12% tetrahydrofurfuryl alcohol | 0.05% EDTA | 0.4% 4-nitrobenzotriazole | 0.1% N2-methyl-L-Arginine | remainder |
| FE-26 | 8% ethylene glycol monoacetate | 0.03% DTPA | 0.08% 5-methoxybenzotriazole | 0.04% arginine | remainder |
| FE-27 | 10% EGBE/10% DAA | 0.3% EDTA/0.2% DTPA | 0.5% 5-methyl-benzotriazole | 1% N-(2-aminopropyl) glycine | remainder |
| FE-28 | 5% EGBE/10% propylene glycol | 0.05% triethylenetetramine-hexaacetic acid | 0.1% 1-amino-benzotriazole | 0.1% N-(2-aminopropyl)glycine | remainder |
| FE-29 | 2% EGBE | 0.1% DTPA | 0.5% 1-amino-benzotriazole/0.5% benzotriazole-5-carboxylic acid | 0.15% arginine | remainder |

What is claimed is:

1. A cleaning composition, comprising:
   1) at least one chelating agent in an amount of from about 0.01% to about 0.5% by weight of the composition, the chelating agent being a polyaminopolycarboxylic acid;
   2) at least one organic solvent selected from the group consisting of water soluble alcohols, water soluble ketones, water soluble esters, and water soluble ethers, the at least one organic solvent being in an amount of about 2% to about 20% by weight of the composition;
   3) at least one monocarboxylic acid containing a primary or secondary amino group and at least one additional basic group containing nitrogen, the at least one monocarboxylic acid being in an amount of from about 0.02% to about 2% by weight of the composition;
   4) at least one metal corrosion inhibitor, the metal corrosion inhibitor being a substituted or unsubstituted benzotriazole and in an amount of from about 0.05% to about 2% by weight of the composition; and
   5) water;
   wherein the pH of the composition is between 7 and 9;
   wherein the polyaminopolycarboxylic acid is selected from the group consisting of mono- or polyalkylene polyamine polycarboxylic acids, polyaminoalkane polycarboxylic acids, polyaminoalkanol polycarboxylic acids, and hydroxyalkylether polyamine polycarboxylic acids; and
   wherein the monocarboxylic acid is a compound of Structure (I):

$(R^3NH)C(R^1)(R^2)CO_2H$ (I), wherein each of $R^1$ and $R^2$, independently, is a hydrogen atom, $C_1$-$C_4$ alkyl, or a group having at least one nitrogen-containing basic group; and $R^3$ is a hydrogen atom, $C_1$-$C_{10}$ alkyl, or a group having at least one nitrogen-containing basic group; wherein at least one of $R^1$, $R^2$, and $R^3$ is a group having at least one nitrogen-containing basic group.

2. The composition of claim 1, wherein the pH of the composition is between 7 and about 8.2.

3. The composition of claim 1, wherein the polyaminopolycarboxylic acid is selected from the group consisting of butylenediaminetetraacetic acid, diethylenetriaminepentaacetic acid, ethylenediaminetetrapropionic acid, triethylenetetraminehexaacetic acid, 1,3-diamino-2-hydroxypropane-N,N,N',N'-tetraacetic acid, propylenediaminetetraacetic acid, ethylenediaminetetraacetic acid, trans-1,2-diaminocyclohexane tetraacetic acid, ethylendiamine diacetic acid, ethylenediamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, iminodiacetic acid; 1,4,7,10-tetraazacyclododecane-tetraacetic acid, diaminopropanol tetraacetic acid, and (hydroxyethyl)ethylenediaminetriacetic acid.

4. The composition of claim 1, wherein the composition comprises from about 0.05% to about 0.3% by weight of the polyaminopolycarboxylic acid.

5. The composition of claim 1, wherein $R^1$ is a group having at least one nitrogen-containing basic group, in which the group having at least one nitrogen-containing basic group is $C_1$-$C_{10}$ alkyl substituted by amino, guanidinyl, or imidazolyl and optionally further substituted by OH.

6. The composition of claim 5, wherein $R^2$ is H or $C_1$-$C_{10}$ alkyl and $R^3$ is H, $C_1$-$C_{10}$ alkyl, or a group having at least one nitrogen-containing basic group, in which the group having at least one nitrogen-containing basic group is $C_1$-$C_{10}$ alkyl optionally substituted by amino, guanidinyl, or imidazolyl and optionally further substituted by OH.

7. The composition of claim 1, wherein $R^3$ is a group having at least one nitrogen-containing basic group, in which the group having at least one nitrogen-containing basic group is $C_1$-$C_{10}$ alkyl substituted by amino, guanidinyl, or imidazolyl and optionally further substituted by OH.

8. The composition of claim 7, wherein each of $R^1$ and $R^2$, independently, is H or $C_1$-$C_4$ alkyl.

9. The composition of claim 1, wherein the monocarboxylic acid is selected from the group consisting of lysine, 2,3-diaminobutyric acid, 2,4-diaminobutyric acid, ornithine, 2,3-diaminopropionic acid, 2,6-diaminoheptanoic acid, 4-methyl lysine, 3-methyl lysine, 5-hydroxylysine, 3-methyl-L-arginine, arginine, homoarginine, $N^5$-monomethyl-L-arginine, $N^5$-[imino(methylamino)methyl]-D-ornithine, canavanine, histidine, N-(2-aminoethyl)glycine, N-(2-aminopropyl)glycine, $N^2$-methyllysine, $N^2$-methyl-L-arginine, $N^2$-(2-aminoethyl)-D-arginine, $N^2$-(2-aminoethyl)-L-arginine, 2-methyllysine, 2-methyl-L-arginine, 3,4-diaminobutyric acid, and 3-amino-5-[(aminoiminomethyl)methylamino] pentanoic acid.

10. The composition of claim 1, wherein the composition comprises from about 0.05% to about 1.8% by weight of the monocarboxylic acid.

11. The composition of claim 1, wherein the metal corrosion inhibitor is benzotriazole optionally substituted by at least one substituent selected from the group consisting of alkyl groups, aryl groups, halogen groups, amino groups, nitro groups, alkoxy groups, and hydroxyl groups.

12. The composition of claim 1, wherein the metal corrosion inhibitor is selected from the group consisting of benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1', 1'- diimethylpropyl)-benzotriazole, 5-(1', 1',3'-trimethylbutyl)benzotriazole, 5-n-octyl benzotriazole, and 5-(1', 1',3', 3'-tetramethylbutyl)benzotriazole.

13. The composition of claim 1, wherein the composition comprises from about 0.1% to about 1.5% by weight of the metal corrosion inhibitor.

14. The composition of claim 1, wherein the composition comprises from about 78% to about 98% of the water.

15. The composition of claim 1, further comprising a defoaming agent.

16. The composition of claim 15, wherein the composition comprises from about 1 ppm to about 1000 ppm of the defoaming agent.

17. A method, comprising:
  contacting a semiconductor substrate containing post etch residues and/or post ash residues with a cleaning composition of claim 1.

18. The method of claim 17, further comprising rinsing the semiconductor substrate with a rinse solvent after the contacting step.

19. The method of claim 18, further comprising drying the semiconductor substrate after the rinsing step.

20. The method of claim 19, further comprising forming a semiconductor device from the semiconductor substrate.

21. The composition of claim 1, wherein the pH of the composition is between 7 and about 8.5.

* * * * *

UNITED STATES PATENT AND TRADEMARK OFFICE
CERTIFICATE OF CORRECTION

PATENT NO. : 9,834,746 B2
APPLICATION NO. : 14/485947
DATED : December 5, 2017
INVENTOR(S) : Thomas Dory et al.

Page 1 of 1

It is certified that error appears in the above-identified patent and that said Letters Patent is hereby corrected as shown below:

Column 22
Line 39, in Claim 3, delete "ethylendiamine" and insert -- ethylenediamine --

Column 23
Line 25 (Approx.), in Claim 12, delete "5-phenyl -benzotriazole," and insert
-- 5-phenyl-benzotriazole, --
Line 27 (Approx.), in Claim 12, delete "5-methyl- 1H" and insert -- 5-methyl-1H --

Column 24
Line 5, in Claim 12, delete "aminomethyl ]" and insert -- aminomethyl] --
Lines 5-6, in Claim 12, delete "5-(1', 1'- diimethylpropyl)" and insert -- 5-(1',1'-dimethylpropyl) --
Line 6, in Claim 12, delete "5-(1', 1'," and insert -- 5-(1',1', --
Line 7, in Claim 12, delete "5-n-octyl benzotriazole," and insert -- 5-n-octylbenzotriazole, --
Lines 7-8, in Claim 12, delete "5-(1', 1',3', 3'- tetramethylbutyl)benzotriazole."
and insert -- 5-(1',1',3',3'- tetramethylbutyl)benzotriazole. --

Signed and Sealed this
First Day of May, 2018

Andrei Iancu
*Director of the United States Patent and Trademark Office*